United States Patent

Lewis et al.

[11] Patent Number: 4,599,582
[45] Date of Patent: Jul. 8, 1986

[54] DEVICE FOR SWITCHING A DIELECTRIC-RESONATOR-STABILIZED OSCILLATOR ON AND OFF

[75] Inventors: Gary K. Lewis, Upper Marlboro; Melvin Zisserson, College Park, both of Md.

[73] Assignee: Litton Systems, Inc., College Park, Md.

[21] Appl. No.: 750,505

[22] Filed: Jul. 1, 1985

[51] Int. Cl.[4] ............................................. H03B 5/18
[52] U.S. Cl. .......................... 331/117 D; 331/117 FE; 331/173
[58] Field of Search ..................... 331/96, 99, 107 SL, 331/117 D, 173, 107 DP, 117 FE

[56] References Cited

U.S. PATENT DOCUMENTS 3,991,388 11/1976 Harshbarger .................. 331/173 X
4,149,127 4/1979 Murakami et al. .................... 331/96
4,484,156 11/1984 Khanna et al. ........................ 331/60

Primary Examiner—Siegfried H. Grimm
Attorney, Agent, or Firm—Robert F. Rotella; Michael H. Wallach

[57] ABSTRACT

A circuit is described in combination with a dielectric-resonator-stabilized oscillator operating at microwave frequencies in which a PIN diode serves to shunt the reflected output signal of the stabilizing resonator from the input of the oscillator circuit into a load to turn the oscillator off. By biasing the diode in a reverse or forward direction, the oscillator is made to start or stop oscillating, respectively. This has the effect of switching the output of the oscillator on and off while eliminating thermal transients associated with de-energizing the active element of the oscillator circuit itself, or the necessity for inefficient microwave switches which may pass some signal through.

5 Claims, 1 Drawing Figure

DEVICE FOR SWITCHING A DIELECTRIC-RESONATOR-STABILIZED OSCILLATOR ON AND OFF

The device that is the subject matter of the present invention was developed partially as a result of work done under government contract number N00014-82-C-2071.

BACKGROUND OF THE INVENTION

1. Field Of The Invention

This invention relates to stabilized oscillators operating in the microwave frequency range, and in particular, to a circuit for turning such devices off and on efficiently, without the necessity of having to de-energize the circuit entirely and without the use of isolating switches which must be relatively large to achieve the degree of isolation required.

2. Summary of the Prior Art

Oscillator circuits are used widely in the electronics field for a variety of purposes. Oscillators operating within the microwave region have come to be commonly utilized in the fields of radar and telecommunications, in which the oscillators are employed as sub-components in timing or distance-measuring functions, e.g., local oscillators.

It is well known in the art that a negative resistance oscillator can be created by adding the proper choice of terminating impedences to an unstable, active element.

At microwave frequencies, it is common to employ a gallium arsenide field effect transistor (GaAs FET) as the active element of the oscillator circuit in order to take advantage of the high switching speeds of these devices.

An additional requirement placed on oscillators, particularly those operating in timing and measuring applications, is that of frequency stability. In the 1-20 GHz region, it is not uncommon to employ a resonator having a resonant cavity filled with a dielectric material electrically coupled into the oscillator circuit. If such a resonator is suitably configured to have a very large Q, the frequency stability of the overall oscillator circuit will become primarily a function of the stability of the electrical parameters of the resonator itself and independent of other time-varying parameters in the balance of the circuit. Moreover, if sufficiently large values of Q for the resonator are selected, the effect of the incorporation of the resonator into the circuit is to drive the frequency of the oscillator strongly in the direction necessary to achieve zero phase shift in the tuned circuit, i.e., to restore the drifting frequency of the device to the desired, nominal frequency.

A dielectric-resonator-stabilized oscillator (DRSO) employing a GaAs FET device as the active element of the oscillator in combination with an improved, laser-tunable dielectric resonator coupled into the circuit by means of a stripline transmission line and operating at frequencies in the region of 1-20 GHz with frequency stabilities of 1-5 ppm/°C. is the subject of a co-pending application, Ser. No. 752,297, filed July 5, 1985, and assigned to the same assignee as herein.

In the field in which such circuits as these find application, it is frequently necessary to be able rapidly to switch the oscillator on and off, i.e., to "blank" the oscillator's output signal for brief, periodic increments of time, or it may be desirable to modulate the output of the oscillator.

In the prior art, this was accomplished by removing the biasing voltage from the transistor in the oscillator, which effectively turned the transistor off. However, this method creates frequency stability problems caused by thermal transitions within the components of the oscillator, particularly the transistor, because the power has been turned off. When power is reapplied to the circuit to turn it on, final frequency stability is not achieved for short periods of time until thermal equilibrium is reestablished.

Similarly, placing switches at the output of the oscillator circuit can create isolation problems in that, at microwave frequencies, a simple switch may appear as a closed circuit because of capacitance effects. While microwave switches are known in the art which are capable of achieving as much as 60 db of isolation, their bulky size and expense may preclude their use in some applications.

SUMMARY OF THE INVENTION

It is therefore an object of the present invention to provide a device capable of switching a DRSO on and off without the necessity of turning the transistor of the oscillator circuit on and off so that frequency stability problems related to thermal transitions are eliminated.

It is a further object of the present invention to provide a device capable of blanking the output of a DRSO without the need for bulky, expensive microwave switches.

It is yet a further object of the present invention to provide such a device in a form that is inexpensive and simple to implement within the circuit, yet reliable in operation.

These objects are preferably accomplished by providing a switchable shunt circuit to ground through the characteristic impedance of the transmission line of the oscillator located between the output of the dielectric resonator and the input of the oscillator circuit, in which the switching function of the shunt is accomplished by means of a PIN diode.

DESCRIPTION OF THE DRAWINGS

These and other objects and advantages will become evident to those skilled in the art from a consideration of the following specification in conjunction with the drawing, wherein.

DESCRIPTION OF THE PREFERRED EMBODIMENT

Figure 1:
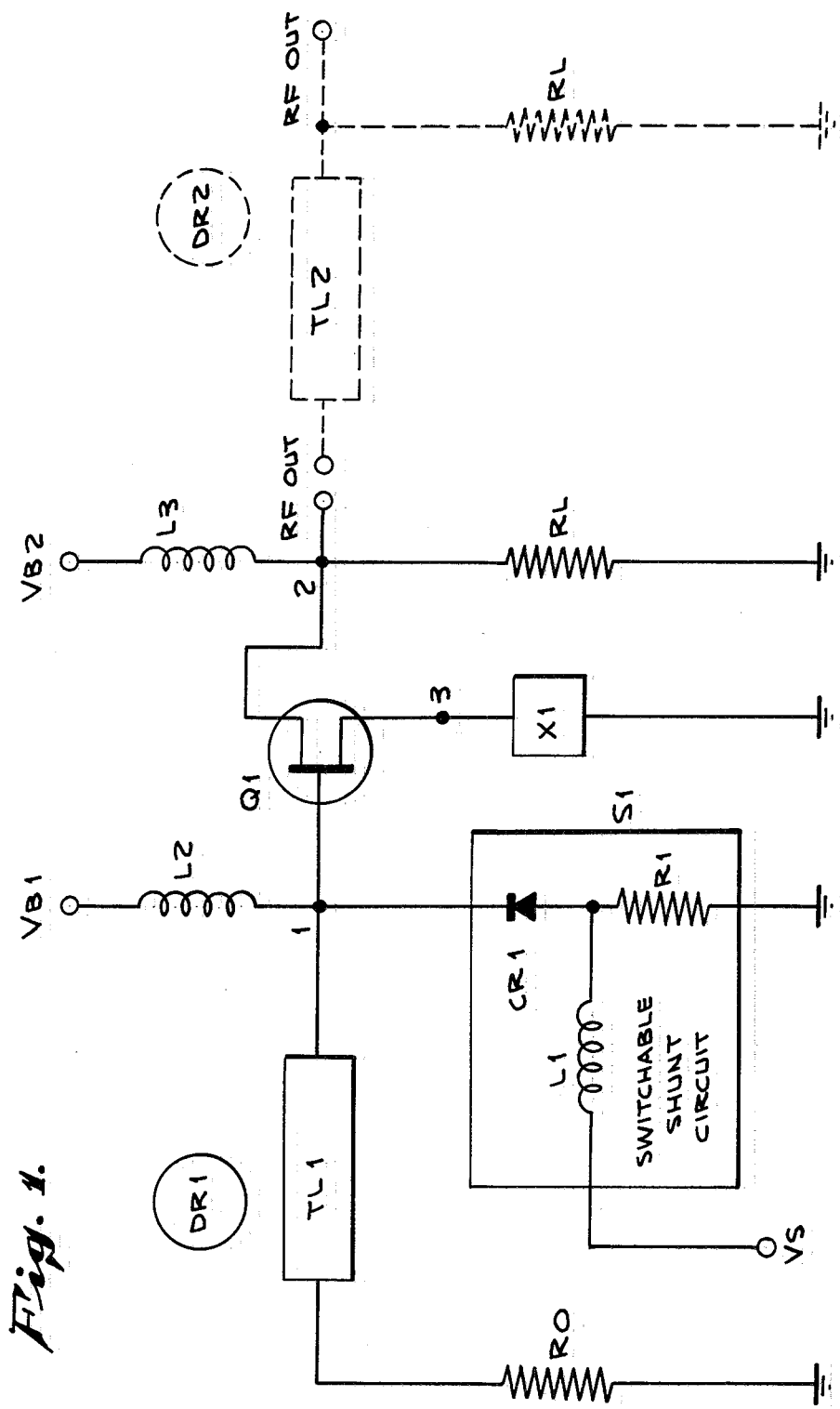
FIG. 1 shows a DRSO circuit wherein the subject of the present invention, a switchable shunt circuit connecting to the oscillator circuit, is shown.

The schematic shown in FIG. 1 is representative of the elements of a dielectric-resonator-stabilized oscillator circuit (DRSO) in which Q1 is a GaAs FET connected in the "common drain" configuration. D.C. biasing voltages VB1 and VB2 bias the transistor through isolating r.f. coils L2 and L3. Connected to the gate of the oscillator is a transmission line TL1 which is terminated at the opposite end by a characteristic impedance Ro. Without the resonator DR1, the transmission line is simply a lossless transmission line terminated in its characteristic impedance, typically 50 ohms. It can sustain no standing waves, will have a VSWR of 1:1 and no signal is reflected back to the oscillator. However, when DR1 is coupled effectively into the circuit as shown, TL1 takes on the characteristics of a lossless transmission line which is terminated in an open circuit.

Thus, the voltage incident on TL1 from the transistor and the reflected voltage on TL1 from the resonator DR1 are in phase at the resonator and at one-half wavelength intervals from the resonator. The VSWR is infinite and the magnitude of the reflection co-efficient is 1.0. Thus, when resonator DR1 is effectively coupled at the appropriate electrical position along TL1, and provided DR1 is appropriately tuned, the circuit will resonant with a stable frequency output Vout. In another embodiment of the DRSO, an optional, second resonator DR2 is incorporated in the output leg of the oscillator by means of a second transmission line TL2. The incorporation of this second resonator DR2 permits an additional degree of frequency stability to be achieved.

A pure reactance X1 is shown connecting the drain of the transistor Q1 to ground. Since the oscillator can be implemented in at least two other configurations, i.e., "common source" and "common gate" configurations, the particular value of X1 will be seen to vary, depending upon the configuration implemented.

In the preferred embodiment, the entire circuit is implemented upon a substrate, e.g., an alumina substrate having a dielectric constant that is closely controlled. The GaAs FET Q1, as well as the discrete resistances and reactances, can be implemented in either chip form or packaged form, depending on the configuration desired. Typically, inductances L2 and L3 will have the values on the order of 30 nanohenries, and capacitances will typically have values ranging from 10-100 picofarads. TL1 is typically implemented in the form of a slab-type stripline etched on the substrate. DR1 typically is a cavity device incorporating a conductive housing having a resonant cavity containing a material whose dielectric constant is closely controlled. RF signals from the oscillator are propagated along TL1 in the TEM mode and coupled into the resonator DR1 by closely-coupling the opening of the cavity of resonator DR1 to the transmission line TL1 at the appropriate electrical position along TL1.

GaAs FET's Q1 which have been incorporated successfully in the circuit illustrated are Microwave Semiconductor Corporation part no. MSC88101, Fujitsu Corporation part no. FSX-52 and NEC part no. NE869. Typical biasing voltages for VB1 and VB2 are −1 and +5 VDC, respectively.

In operation, when suitable biasing voltages VB1 and VB2 are applied to transistor Q1, an RF signal will be propagated down transmission line TL1 and reflected back from DR1 in phase with the incident signal. The output signal Vout or Vout' appears at node 2, or the output of the second transmission line TL2 if a second, optional resonator DR2 is employed. In the prior art, the overall circuit was turned off either by turning off Q1, i.e., by removing the biasing voltge VB1 and BV2, or in the alternative, by incorporating a microwave switch at the output of the oscillator (not illustrated). However, this leads to the difficulties described above in that, when transistor Q1 is turned off, it ceases to dissipate power, and consequently, will cool in temperature. When the power to the transistor Q1 is restored, it again dissipates power, causing it to heat. This on-off switching of the transistor therefore results in thermal transients in it and the components of the circuit closely related to the location of the transistor. This, in turn, results in a frequency instability within the device until the thermal transients die out.

Similarly, a simple switch placed at the output of the oscillator is relatively ineffective for completly blanking the output of the oscillator because, at microwave frequencies, a simple switch behaves as a capacitance and will couple some of the output signal into the circuit beyond the switch. Thus, where relatively large amounts of isolation are required between the oscillator and the rest of the circuit, special microwave switches become obligatory. This is undesirable from the standpoint of both cost and size.

It has been discovered that a DRSO can be effectively switched on and off at relatively high rates of speed without the problems attendant upon the prior art by the incorporation of a switchable shunt circuit S1 in keeping with the subject of the present invention, whose elements are illustrated within the block of FIG. 1.

In the preferred embodiment, the present invention comprises the shunt circuit S1 interposed along TL1 between the output of the resonator DR1 and the input of the transistor Q1, which shunt goes to ground through a load or resistance R1, usually the characteristic impedance of the transmission line TL1 and, in the preferred embodiment, is 50 ohms. When the shunt leg is connected to the transmission line TL1, the incident signal from Q1 and the reflected signal from resonator DR1 are effectively dissipated in R1. Since no signal can now be reflected back to Q1 from DR1, transistor Q1 ceases to oscillate. Since the biasing voltages VB1 and VB2 have not been removed from transistor Q1, it continues to operate as a stable amplifier and to dissipate power, but cannot oscillate, since the connection from the resonator has been effectively severed. Upon the removal of the shunt from the circuit, the resonator is effectively reconnected and Q1 will immediately begin to oscillate.

Since the transistor Q1 is not switched off during blanking, thermal equilibrium within the circuit is retained, eliminating any frequency instability due to thermal transients. Likewise, since the transistor has ceased oscillating altogether, effective isolation is achieved at the output of the oscillator well in excess of that achievable with conventional microwave switches.

In order to connect and disconnect the shunt circuit to the oscillator circuit, some form of switch means must be incorporated. Those skilled in the art will recognize that this may be accomplished by the incorporation of a relay switch or a transistor in the shunt leg between the circuit S1 and the load R1. In the preferred embodiment illustrated, the switch takes the form of a PIN diode CR1 connected in series between junction 1 and the load R1. A suitable isolating coil L1 permits a DC biasing voltage Vs to be imposed on diode CR1 to bias the diode in a "open" or "shut" configuration. Thus, if CR1 is biased in the forward direction, i.e., if Vs is more positive than VB1, the diode will be forward-biased and will conduct, causing Q1 to cease oscillating. If Vs is altered with respect to VB1 to back-bias CR1, the effect is to "open" the shunt leg, causing the oscillator to resume ascillation.

PIN diodes are well known in the art and consist of an intrinsic semiconductor layer located at the junction between the p-doped and n-doped layers of a conventional diode. By the incorporation of this intrinsic region at the p-n junction, the transition capacitance of the diode is reduced significantly, permitting the device to conduct at microwave frequencies.

In the preferred embodiment, PIN diodes which have been found to be effective as switches are Microwave Associates part no. MA-4P202 (a chip device) and Hewlett Packard part no. HP-ND4005 (a beam-lead device). Typically, the isolating coil L1 will have a value on the order of 30 nanohenrys.

The particular parts and configuration of the preferred embodiment are disclosed for illustrative purposes only, and alternative embodiments, parts and materials will readily suggest themselves to those skilled in the art.

Accordingly, the scope of our invention as disclosed herein, a means for switching the output of a DRSO on and off, should be limited only by the following claims:

We claim:

1. In a device for switching a dielectric-resonator-stabilized oscillator of the type which includes an RF oscillator circuit having at least one active element, a tunable dielectric resonator, said dielectric resonator being tuned to a frequency within the resonant frequency region of said oscillator circuit, and a transmission line having a characteristic impedance to interconnect said resonator to said oscillator circuit, the improvement comprising:

a shunt to ground through the characteristic impedance of said transmission line, connectable between said oscillator circuit and said dielectric resonator; and means for connecting and disconnecting said shunt to said transmission line.

2. The device as recited in claim 1, wherein said means for connecting and disconnecting said shunt to said transmission line further comprises a switch.

3. The device as recited in claim 1, wherein said means for connecting and disconnecting said shunt to said transmission line further comprises a transistor.

4. The device as recited in claim 1, wherein:

said shunt to ground includes a diode connected in series between said transmission line and said characteristic impedance, and said means for connecting and disconnecting said shunt includes means for biasing said diode in a rearward and forward direction.

5. The device as recited in claim 4, wherein said diode is a PIN diode.

* * * * *